(12) United States Patent
Ito et al.

(10) Patent No.: US 10,401,729 B2
(45) Date of Patent: Sep. 3, 2019

(54) ROLLER MOLD MANUFACTURING APPARATUS AND METHOD

(71) Applicant: ASAHI KASEI KABUSHIKI KAISHA, Tokyo (JP)

(72) Inventors: Naoto Ito, Tokyo (JP); Toshio Kitada, Tokyo (JP)

(73) Assignee: ASAHI KASEI KABUSHIKI KAISHA, Tokyo (JP)

( * ) Notice: Subject to any disclaimer, the term of this patent is extended or adjusted under 35 U.S.C. 154(b) by 1000 days.

(21) Appl. No.: 14/401,039

(22) PCT Filed: May 10, 2013

(86) PCT No.: PCT/JP2013/063177
§ 371 (c)(1),
(2) Date: Nov. 13, 2014

(87) PCT Pub. No.: WO2013/172267
PCT Pub. Date: Nov. 21, 2013

(65) Prior Publication Data
US 2015/0138522 A1   May 21, 2015

(30) Foreign Application Priority Data
May 14, 2012  (JP) .................. 2012-110877

(51) Int. Cl.
*G03F 7/20* (2006.01)
*G03F 7/00* (2006.01)
(Continued)

(52) U.S. Cl.
CPC .......... *G03F 7/2022* (2013.01); *G03F 7/0002* (2013.01); *G03F 7/24* (2013.01); *B29C 33/38* (2013.01)

(58) Field of Classification Search
CPC ........ G03F 7/2022; G03F 7/0002; G03F 7/24; B29C 33/38; B29C 59/02; B29C 59/002;
(Continued)

(56) References Cited

U.S. PATENT DOCUMENTS 5,605,097 A * 2/1997 Ruckl .................... B41C 1/145
101/128.4
8,378,258 B2 * 2/2013 Sercel ................ B23K 26/0732
219/121.69
(Continued)

FOREIGN PATENT DOCUMENTS

EP        2752895 A1     7/2014
JP        2004-125913 A  4/2004
(Continued)

OTHER PUBLICATIONS

Extended European Search Report for European Application No. 13791468.5, dated May 8, 2015.
(Continued)

*Primary Examiner* — Dana Ross
*Assistant Examiner* — Joseph M Baillargeon
(74) *Attorney, Agent, or Firm* — Birch, Stewart, Kolasch & Birch, LLP

(57) ABSTRACT

In a so-called step-and-repeat method in which a mask pattern is circumferentially written by exposure onto each predetermined region on a surface of a roller mold, an object of the present invention is to improve the spacing accuracy between the mask patterns and to suppress the occurrence of misalignment at a seam when the mask pattern has been written onto a 360-degree circumference. For that object, a roller mold manufacturing apparatus according to the present invention comprises: a mask 3 having a function of transmitting part of an irradiating substance; a rotational drive apparatus that rotates a roller mold 100 around a
(Continued)

rotational shaft; a rotation amount detection sensor that detects an amount of rotation; a control apparatus that sends a control signal for adjusting a circumferential position of writing onto a resist of the roller mold with the irradiating substance; and an actuator 7 that moves the mask 3 linearly, wherein a predetermined area is irradiated with the irradiating substance in a state where rotation of the roller mold 100 is stopped, the roller mold 100 is then rotated by a predetermined amount and stopped, and a circumferential position of writing is adjusted for irradiating another predetermined area with the irradiating substance.

13 Claims, 16 Drawing Sheets

(51) Int. Cl.
*G03F 7/24* (2006.01)
*B29C 33/38* (2006.01)

(58) Field of Classification Search
CPC .. H01J 37/3174; H01J 37/3045; H04N 1/506; B82Y 10/00; G11B 5/855
USPC .......... 355/67; 430/30, 200, 296, 320; 219/121.19, 121.2, 121.31, 121.68–69, 219/121.7, 121.73, 121.83, 121.77, 219/121.25; 264/400, 284; 216/41; 347/110, 256; 425/150, 347, 554
See application file for complete search history.

(56) References Cited

U.S. PATENT DOCUMENTS

| | | |
|---|---|---|
| 2012/0062680 A1 | 3/2012 | Toya |
| 2013/0068734 A1 | 3/2013 | Ito et al. |

FOREIGN PATENT DOCUMENTS

| | | | |
|---|---|---|---|
| JP | 2005-331893 A | | 12/2005 |
| JP | 2009-274347 A | | 11/2009 |
| JP | 2009-288340 A | | 12/2009 |
| JP | 2009288340 A | * | 12/2009 |
| JP | 2011-118049 A | | 6/2011 |
| WO | WO 2011/158714 A | | 12/2011 |
| WO | WO 2012/128467 A2 | | 9/2012 |

OTHER PUBLICATIONS

International Preliminary Report on Patentability and Written Opinion of the International Searching Authority, dated Nov. 18, 2014, issued in the corresponding International Application No. PCT/JP2013/063177.
International Search Report, dated Jul. 9, 2013, issued in the corresponding International Application No. PCT/JP2013/063177.

* cited by examiner

⟨ROLLER WITH DIAMETER φ OF 100 [mm]⟩

| ANGULAR DIFFERENCE: θ [arc-sec] | ANGLE OF TANGENT TO CIRCLE [arc-sec] | CORRECTION AMOUNT OF MASK POSITION: X [μm] | DISTANCE VARIATION BETWEEN MASK AND ROLLER(H2-H1) [μm] |
|---|---|---|---|
| 1 | 1 | 0.24 | 0.000 |
| 5 | 5 | 1.21 | 0.000 |
| 10 | 10 | 2.42 | 0.000 |
| 20 | 20 | 4.85 | 0.000 |
| 50 | 50 | 12.12 | 0.001 |
| 100 | 100 | 24.24 | 0.006 |

DEVELOPMENT VIEW

FIG.14A
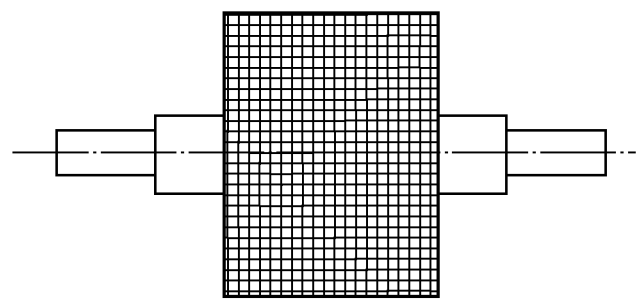
FIG.14B    DEVELOPMENT VIEW
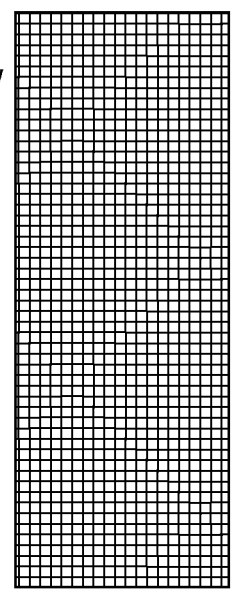

ROLLER MOLD MANUFACTURING APPARATUS AND METHOD

TECHNICAL FIELD

The present invention relates to a method and apparatus for manufacturing a roller mold. More specifically, the present invention relates to the improvement of technology for increasing the accuracy of writing onto a roller mold.

BACKGROUND ART

Attempts have heretofore been made to control or improve the characteristics of optical devices, such as LEDs and LDs, by forming a periodic structure with a pitch almost the same as the wavelength of light on a surface or inside of the optical devices. The periodic structure for such purpose is produced in various ways of fine processing. Among such various ways of fine processing, nanoimprinting is one of the techniques that is now considered most promising. A mold (stamping die) used in a nanoimprint stamping die transfer process is usually manufactured by an optical exposure apparatus.

For molds used in a stamping die transfer process, not only planar molds used in planar pressing, but also roller-shaped molds (roller molds) which rotate to enable continuous transfer to a film have been developed. Conventional roller molds are manufactured by attaching a flexible material, such as a thin film of metal, to a roller. Such a mold has a cut line on the attached material and a pattern transferred therefrom may have a seam when the mold rotates 360 degrees. In order to avoid such problem, a pattern writing method combining exposure with the rotation of the roller mold has been used.

In the pattern writing that combines the roller mold rotation and exposure as described above, the conventionally-used methods of exposure include: a method of focusing an electron beam through a lens and irradiating a resist with the beam so as to write a pattern on the resist (see FIG. 11); and a method of irradiating a mask having an aperture pattern formed thereon with an electron beam which has been formed into substantially parallel light beams through a lens, so as to irradiate a resist with a plurality of electron beams that have passed through the mask, thereby simultaneously writing a pattern with the electron beams on the resist (see FIG. 12).

Further, examples of the method for writing a pattern by combining the roller mold rotation and exposure include: (1) a method of writing a groove-like pattern by continuously rotating the roller mold (see FIGS. 13A and 13B, such mold pattern is sometimes called a "line-and-space" pattern due to its form); and (2) a method of exposing a certain area of the roller mold with rotation of the roller mold being stopped and then feeding the roller mold at a predetermined angle in order to expose the next area, so as to sequentially write a predetermined pattern (mask pattern) in the circumferential direction on the roller mold, and, after a 360-degree rotation of the roller mold, moving in the axial direction and similarly performing the sequential exposure of the roller mold in the circumferential direction in order to write the predetermined pattern thereon (see FIGS. 14A and 14B, such method is sometimes called a "step-and-repeat" method due to its form).

With regard to the latter method (step-and-repeat), a technique has been proposed in which, when a repeated pattern (mask pattern) on the original substrate is transferred by exposure onto a side surface of a sample which is to be exposed, a step of exposure and a step of rotating the sample such that the side surface of the sample rotates by a distance corresponding to one cycle of the repeated pattern (mask pattern) are repeated alternately in order for the repeated mask pattern to be formed on the side surface of the sample with a high level of spacing accuracy (see, for example, Patent Document 1 below).

PRIOR ART REFERENCE

Patent Document

Patent Document 1: JP2005-331893 A

SUMMARY OF THE INVENTION

Problem to be Solved by the Invention

Although attempts have been made to improve the spacing accuracy in the techniques such as the one described in Patent Document 1, there are some cases in which certain misalignment inevitably occurs at a seam (joint) of the mask pattern when the roller mold rotates 360 degrees. If the spacing accuracy between the mask patterns is insufficient and if misalignment occurs at a seam after a 360-degree rotation, the resulting roller mold is unable to serve as a roller mold for use in a stamping die transfer process.

Under these circumstances, an object of the present invention is to provide an apparatus and method for manufacturing a roller mold based on a so-called step-and-repeat method in which a mask pattern is circumferentially written by exposure onto each predetermined region on a surface of a roller mold, the method and apparatus being capable of improving the spacing accuracy between the mask patterns and suppressing the occurrence of misalignment at a seam when the mask pattern has been written onto a 360-degree circumference of the roller mold.

Means for Solving the Problem

In order to solve the above problem, the present inventors conducted various studies. For example, in the case where a mask pattern is composed of a plurality of regularly arranged blocks and where a pitch (circumferential spacing) P1 between the blocks in a single mask pattern is set so as to be equal to a joining pitch P2 between an end block in one mask pattern and an end block in an adjacent mask pattern (see FIGS. 7 and 8), the accuracy of circumferential joining between the mask patterns is a material issue. Common methods for improving or ensuring such circumferential joining accuracy between the mask patterns include using a rotary encoder to measure an amount of rotation (angle of rotation) of the roller mold and activating a motor with high accuracy based on the result of the measurement in order to feed the roller mold at a predetermined angle (rotate the roller mold circumferentially by a predetermined amount) (see FIGS. 15 and 16).

If nano-level joining accuracy is required between the mask patterns, positioning needs to be performed at an accuracy of 1 [arc-sec] ($=\frac{1}{3600}$ [deg]) or better; however, motors do not have such level of positioning accuracy. That is, a rotary encoder, even if it is a commercially available common product, can provide a sufficient level of resolution; whereas, it is difficult for a motor, even if it is a high-performance product, to exhibit sufficient feeding resolution to achieve positioning with an accuracy of 1 [arc-sec] or better. Thus, even if it is possible to determine with a high level of accuracy a position at which the roller mold should be stopped, based on the angular measurement resolution of the rotary encoder, it is difficult to actually stop the roller mold at such position with a high level of accuracy by way of a motor having a currently available level of feeding resolution (e.g., about 100 [arc-sec]) (see FIG. 17).

One possible technique for overcoming the above problem is to provide not only a motor as described above (Motor 1) but also a rotational drive apparatus capable of performing fine feeding (for example, a rotational stage (Motor 2) having a piezo device) (see FIG. 18) so as realize highly accurate feeding resolution by a two-step configuration of the motor and the drive apparatus (see FIG. 19). However, such two-step configuration of drive apparatuses will lead to high costs and, furthermore, the routing of wires will be difficult, which may complicate the apparatus.

The present inventors further continued their studies in view of the above results, and obtained a finding leading to a solution of the problem. The present invention is based on such finding and provides an apparatus for manufacturing a roller mold which is a roller-shaped stamping die for transferring a pattern, the apparatus comprising:

an irradiation apparatus that irradiates a predetermined area of the roller mold, which is coated with a resist, with an irradiating substance in a state where rotation of the roller mold is stopped;

a mask having a function of allowing part of the irradiating substance applied from the irradiation apparatus to pass through the mask;

a rotational drive apparatus that rotates the roller mold around a rotational shaft;

a rotation amount detection sensor that detects an amount of rotation of the roller mold while being rotated by the rotational drive apparatus;

a control apparatus that receives a detection signal from the rotation amount detection sensor and sends a control signal for adjusting a circumferential position of irradiation when the resist of the roller mold is irradiated with the irradiating substance; and an actuator that moves the mask linearly in accordance with the control signal from the control apparatus, wherein a predetermined area is irradiated with the irradiating substance in a state where rotation of the roller mold is stopped, the roller mold is then rotated by a predetermined amount and stopped, and a circumferential position of irradiation is adjusted for irradiating another predetermined area with the irradiating substance.

In the above roller mold manufacturing apparatus, after the rotation of the roller mold around the rotational shaft by the rotational drive apparatus, the mask is slightly moved by the actuator in accordance with the control signal from the control apparatus. With this configuration, the circumferential writing position can be finely adjusted by changing the position of exposure, without the need to slightly feed the roller mold. The problems occurring in the above-described conventional configuration, such as high costs, a complicated configuration of the apparatus due to difficult routing of wires, etc., will not occur in the manufacturing apparatus having such configuration.

In addition, since the above roller mold manufacturing apparatus moves the mask linearly, the mechanism or configuration for such movement can be simplified. In this respect as well, the manufacturing apparatus according to the present invention is desirable in being able to reduce costs and simplify the configuration with ease.

In the above roller mold manufacturing apparatus, the mask may be a device that forms the irradiating substance that has passed through the mask into a plurality of parallel light beams.

Further, the actuator may move the mask in a direction perpendicular to the irradiation direction of the irradiating substance. In that case, the actuator may be a piezoelectric actuator.

In the roller mold manufacturing apparatus according to the present invention, the irradiating substance may be, for example, an electron beam. Alternatively, the irradiating substance may be light.

The present invention also provides a method for manufacturing a roller mold which is a roller-shaped stamping die for transferring a pattern, the method comprising:

causing an irradiating substance applied from an exposure apparatus to pass through a mask so as to form the irradiating substance into a plurality of beams of irradiating substance;

rotating the roller mold, which is coated with a resist, around a rotational shaft and stopping the roller mold at a predetermined position;

detecting an amount of rotation of the roller mold and sending from a control apparatus a control signal for adjusting a circumferential position on the resist of the roller mold for irradiation with the irradiating substance;

moving the mask linearly in accordance with the control signal;

adjusting a position on the resist of the roller mold for irradiation with the irradiating substance; and irradiating the roller mold with the irradiating substance that has passed through the mask.

In the above manufacturing method, the irradiating substance that has passed through the mask may be formed into a plurality of parallel light beams.

Further, the above manufacturing method may move the mask with an actuator in a circumferential direction of the roller, which is perpendicular to the irradiation direction of the irradiating substance.

Effect of the Invention

According to the present invention, in a so-called step-and-repeat method in which a mask pattern is circumferentially written by exposure onto each predetermined region on the surface of a roller mold, it is possible to improve the spacing accuracy between the mask patterns and to suppress the occurrence of misalignment at a seam when the mask pattern has been written onto a 360-degree circumference.

BRIEF DESCRIPTION OF THE DRAWINGS

FIG. 14A is an overall view of a roller mold attached around a rotational shaft and FIG. 14B is a development view of the surface of the roller mold, for illustrating one example of a step-and-repeat pattern formed on the roller mold.

MODE FOR CARRYING OUT THE INVENTION

Hereinafter, the configuration of the present invention will be specifically described based on exemplary embodiments shown in the attached drawings.

Figure 1:
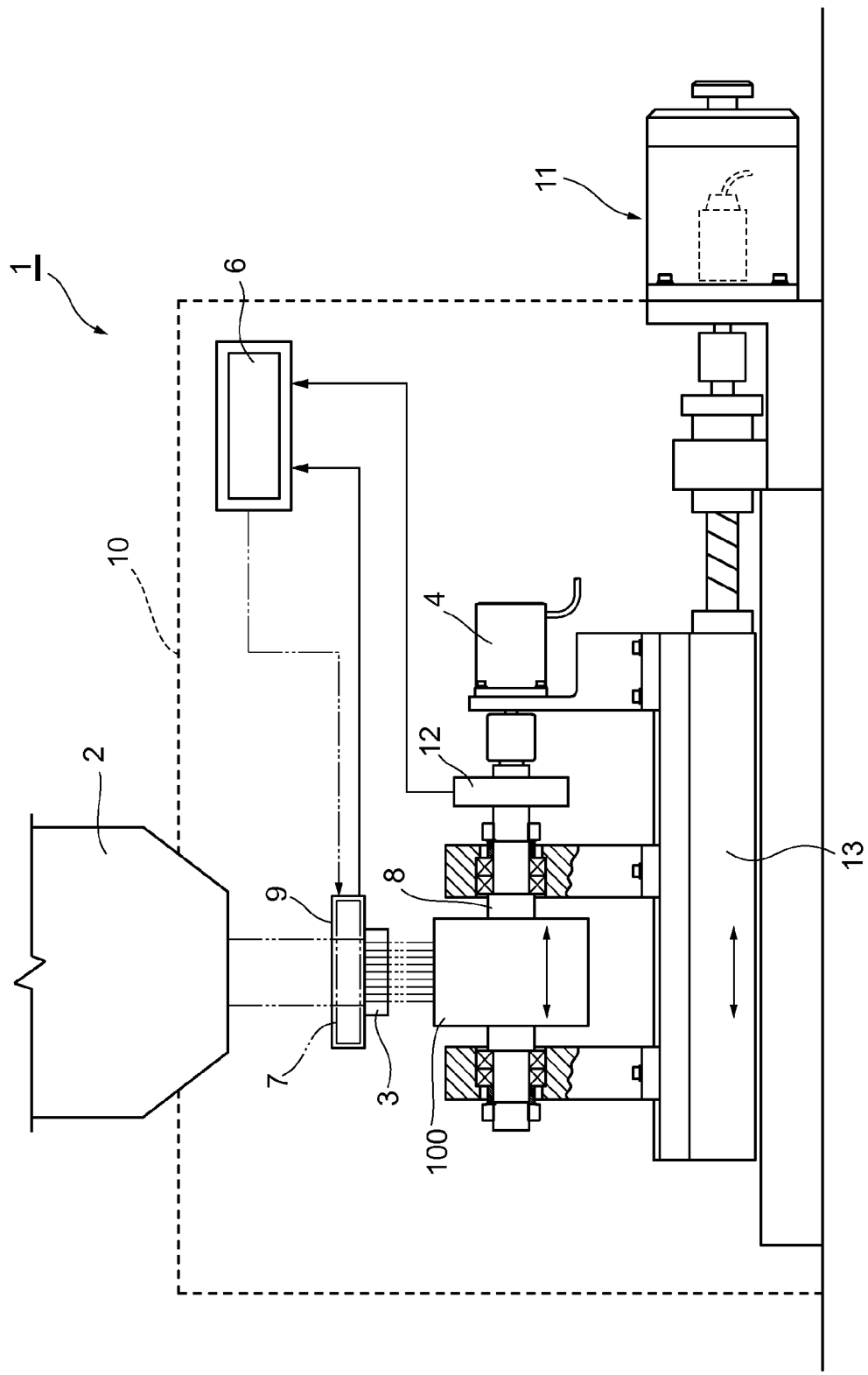
FIG. 1 is a view illustrating the configuration of a roller mold manufacturing apparatus according to an embodiment of the present invention.

FIG. 1, etc., illustrate embodiments of an apparatus and method for manufacturing a roller mold according to the present invention. A roller mold manufacturing apparatus 1 according to the present invention is an apparatus for manufacturing a roller mold 100 which is a roller-shaped stamping die for transferring a pattern. In this embodiment, the apparatus 1 includes, for example, an electron beam irradiation apparatus 2, a stencil mask 3, a rotational drive motor (rotational drive apparatus) 4, a control apparatus 6, an actuator 7, a rotational shaft 8, a stage 9, a sample chamber 10, an axial movement motor 11, a rotary encoder (rotation amount detection sensor) 12, and an axially moving stage 13. The roller mold manufacturing apparatus 1 irradiates the stencil mask 3 with an electron beam so that a resist applied to the cylindrical roller mold 100 is irradiated and exposed to the electron beam that has passed through an aperture pattern formed on the stencil mask 3.

The roller mold 100, being a subject to be manufactured, is a roller-shaped mold which enables continuous transfer to a film by way of its rotation. The roller mold 100 in this embodiment is formed in a cylindrical shape and is attached around the rotational shaft 8 of the roller mold manufacturing apparatus 1. A resin (resist) which is sensitive to an electron beam is evenly applied to the surface of the roller mold 100.

The electron beam irradiation apparatus 2 is one type of irradiation apparatus for use in exposure, and it applies an electron beam toward the resist-coated roller mold 100. In this embodiment, an electron beam is applied in a downward direction from above the stencil mask 3 which is arranged close to the roller mold 100.

Figure 3:
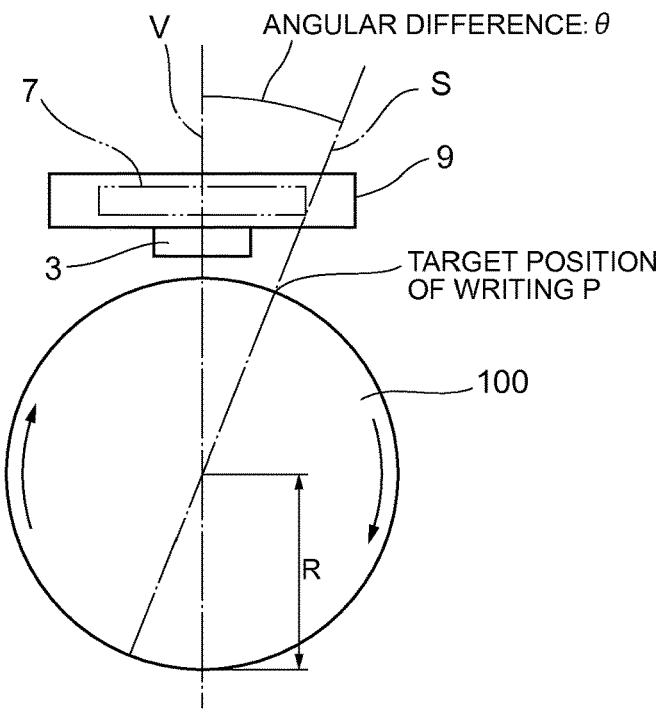
FIG. 3 is a view illustrating a roller mold, a stencil mask and a stage when seen from the axial direction of a rotational shaft.

The stencil mask 3 transmits part of the electron beam applied from the electron beam irradiation apparatus 2, thereby generating a plurality of beams for simultaneous writing onto the resist. A fine pattern for allowing an electron beam to pass only though apertures thereof is formed on the stencil mask 3, and as a result, the stencil mask 3 has a function of transmitting part of the electron beam. The stencil mask itself has a thickness which is at least that necessary to prevent an electron beam from passing therethrough, and is formed by making a pattern of apertures through which an electron beam passes in part of a uniform membrane having a particular area. Such stencil mask 3 is arranged at a position close to the surface of the roller mold 100 (see FIG. 3, etc.). Although not specifically shown in the drawings, the stencil mask 3 in this embodiment is provided such that the mask can move in the circumferential direction of rotation by, for example, being guided by a guide installed in the stage 9 (see FIG. 1). By receiving force from the actuator 7, the stencil mask 3 moves circumferentially. Although not particularly shown in the drawings, the position and any displacement of the stencil mask 3 are detected by, for example, a capacitance-type displacement meter and fed back to the control apparatus 6 (see FIG. 1).

The rotational drive motor (rotational drive apparatus) 4 is a drive source for rotating the roller mold 100 around the rotational shaft at a pitch of a predetermined angle of rotation. The pitch of a predetermined angle of rotation can be detected by using, for example, the rotary encoder 12 connected to the rotational shaft 8.

The rotation amount detection sensor is a sensor for detecting the amount of rotation of the roller mold 100. In this embodiment, by using the above-mentioned rotary encoder 12, the amount of rotation of the roller mold 100 can be detected optically. It should be noted that a sufficient level of resolution for achieving detection with an accuracy of 1

[arc-sec] (=1/3600 [deg]) or better can be obtained even when using a commonly available product for the rotation amount detection sensor.

The control apparatus 6 receives a detection signal from the rotary encoder (rotation amount detection sensor) 12 and sends a control signal for adjusting the circumferential position of electron beam writing on the resist of the roller mold 100. The control signal from the control apparatus 6 is sent to the actuator 7 (see FIG. 1). Examples of the method for sending such control signal include: sending the detected amount of displacement as is; and performing computations, such as PID control, for the detected amount and sending the result of the computations.

Figure 4:
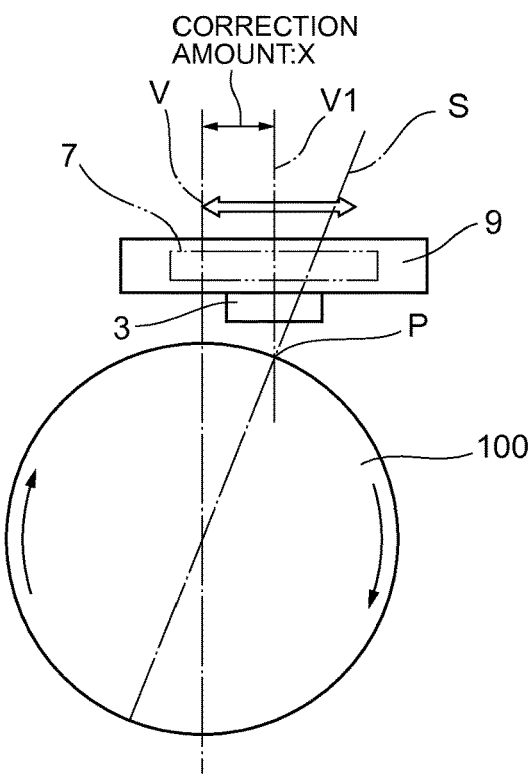
FIG. 4 is a view illustrating the stage and the stencil mask when they are moved from the state shown in FIG. 3.

The actuator 7 moves the stencil mask 3 linearly in accordance with the control signal from the control apparatus 6. In the roller mold manufacturing apparatus 1 of this embodiment, the actuator 7 linearly moves the stencil mask 3 in the circumferential direction of the roller, which is perpendicular to the direction of electron beam irradiation, in order to adjust the position of the electron beam irradiation (see FIGS. 3 and 4). When shifting the position of the electron beam writing as described above, it is also possible to move both the electron beam irradiation apparatus 2 and the stencil mask 3 at the same time by the same amount. However, from the viewpoint of improving responsiveness, it is preferable to move the stencil mask 3 alone, as it is lighter in weight than the electron beam irradiation apparatus 2. As already described above, this embodiment adopts a configuration of irradiating the roller mold 100 with the electron beam that has been applied toward the stencil mask 3 and passed through the aperture pattern thereon. Accordingly, the position of the electron beam writing can be shifted and changed by moving the stencil mask 3, without the need to move the electron beam irradiation apparatus 2.

In this embodiment, a piezoelectric actuator (piezo actuator) having a piezoelectric device (piezo device) is used as the actuator 7. The roller mold manufacturing apparatus 1 using such piezoelectric actuator (a positioning device utilizing piezoelectric effects) can achieve the fine feeding of the stencil mask 3 with a high level of resolution.

The stage 9 moves the stencil mask 3 in a precise manner. The stage 9 of this embodiment is provided to be slidable by, for example, a linear guide, so that the stencil mask 3 may be moved in the circumferential direction of the roller, which is perpendicular to the direction of electron beam irradiation (see FIGS. 3 and 4).

The sample chamber 10 is a chamber which is designed to hold the inside thereof as a vacuum. The above-described stencil mask 3, rotational drive motor 4, etc., are placed into this sample chamber 10 (see FIG. 1).

The axially moving stage 13 is a stage on which the roller mold 100 is placed in a rotatable state and which moves the roller mold 100 in a precise manner in the axial direction of the rotational shaft 8. The axially moving stage 13 is provided to be slidable by, for example, a linear guide, etc., and it may be moved by a predetermined amount in the axial direction of the rotational shaft 8, in accordance with the direction and amount of rotation of the axial movement motor 11 (see FIG. 1). The moving amount of the axially moving stage 13 can be measured by, for example, a laser interferometer (not shown in the drawings).

Figure 2:
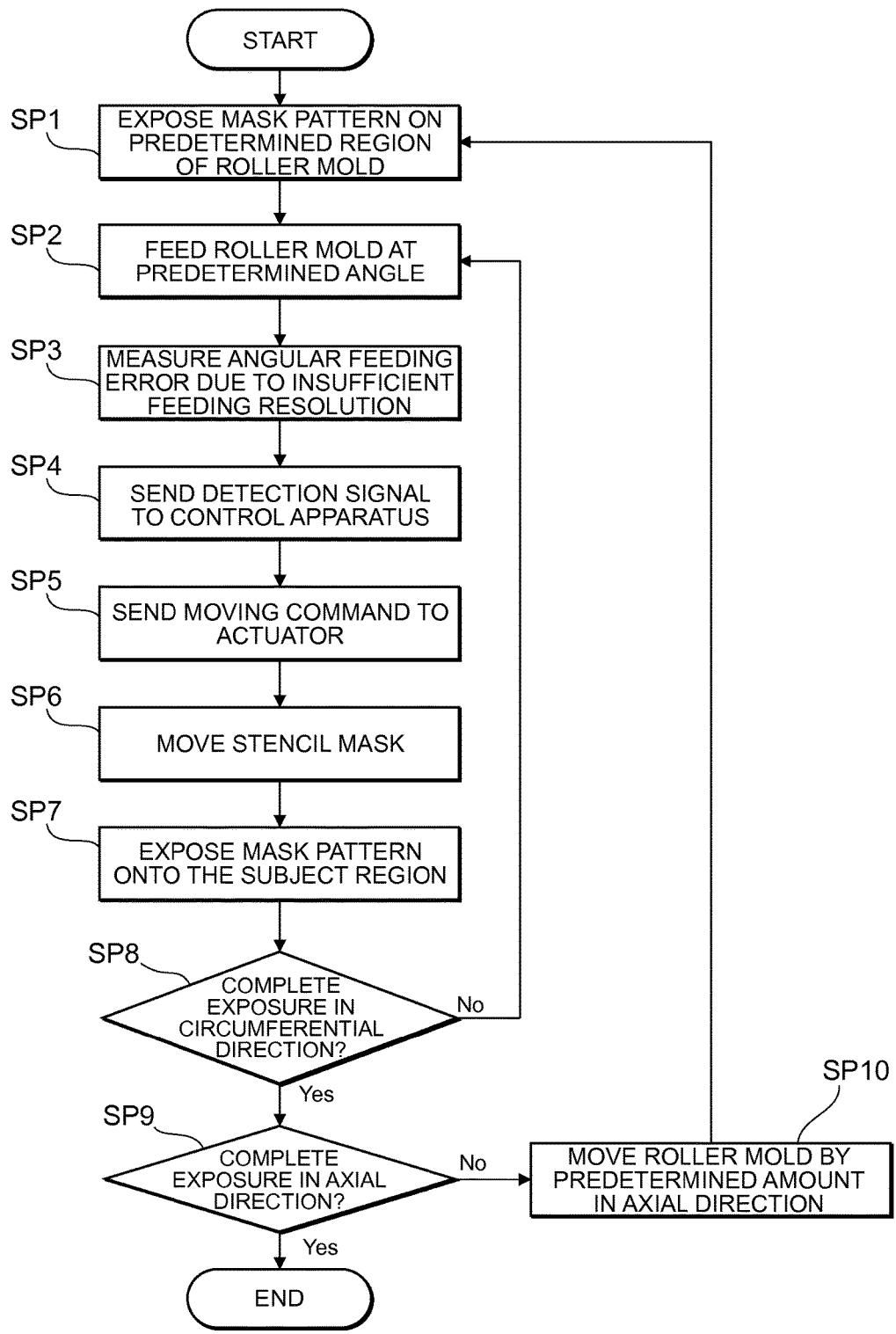
FIG. 2 is a flowchart showing one example of a roller mold manufacturing method.

Next, an example of the roller mold manufacturing method using the above-described roller mold manufacturing apparatus 1 will be described below (see FIG. 2, etc.).

Figure 7:
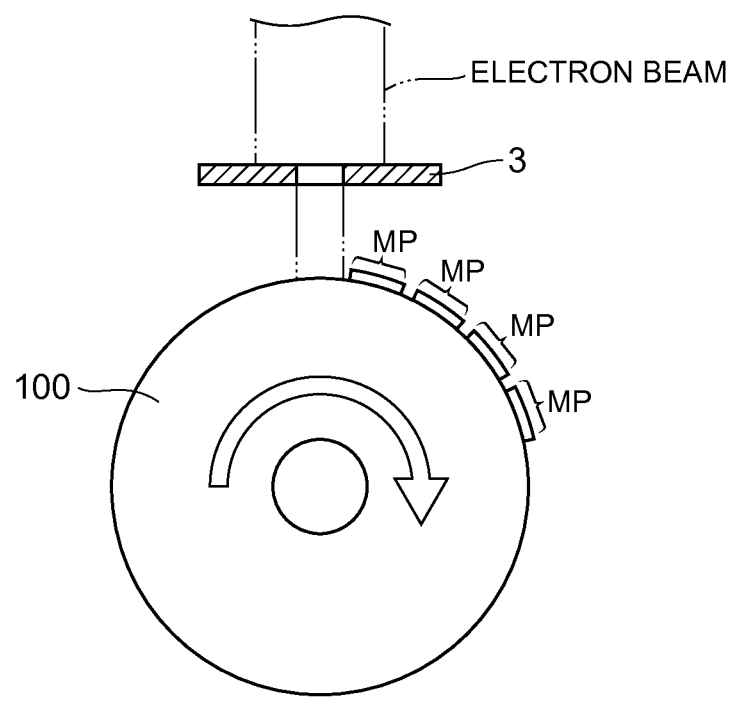
FIG. 7 is a view illustrating a roller mold, a stencil mask and a stage during exposure, when seen from the axial direction of a rotational shaft.
Figure 8:
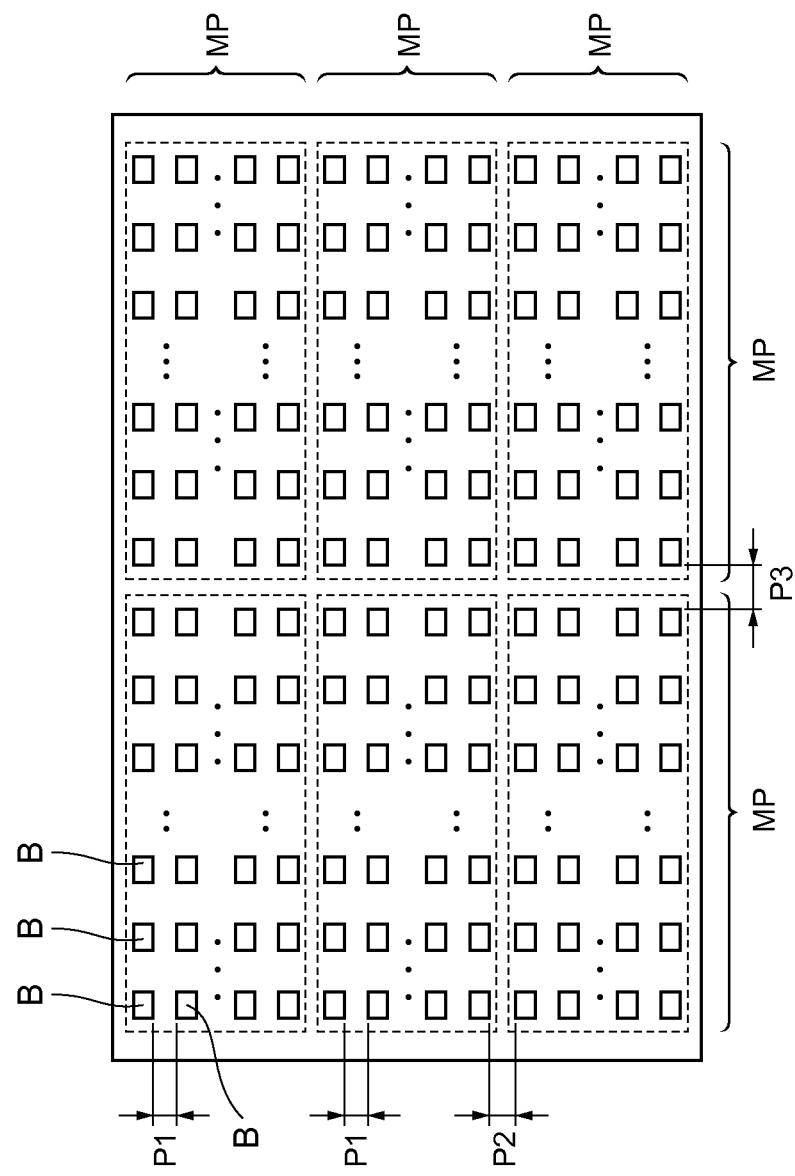
FIG. 8 is a development view of the surface of a roller mold on which a mask pattern has been written.

First, the roller mold manufacturing apparatus 1 exposes a predetermined region of the roller mold 100 and thereby writes a pattern on the region (step SP1). In this step, the roller mold 100, which is arranged close to the stencil mask 3, is rotated by the rotational drive motor 4 and the rotation is stopped at a predetermined position. Then, an electron beam is applied from above the stencil mask 3, so as to expose a resist applied to the roller mold 100 and thereby write a predetermined pattern (hereinafter also referred to as a mask pattern, and denoted by MP in FIGS. 7 and 8) of the stencil mask 3 on the resist.

When the exposure of the predetermined region is finished, the roller mold 100 is rotated and fed at a predetermined angle, so as to subsequently expose the next predetermined region which is circumferentially adjacent to the above predetermined region (step SP2). The angular feeding amount at that time can be detected by using the rotary encoder 12.

Figure 5:
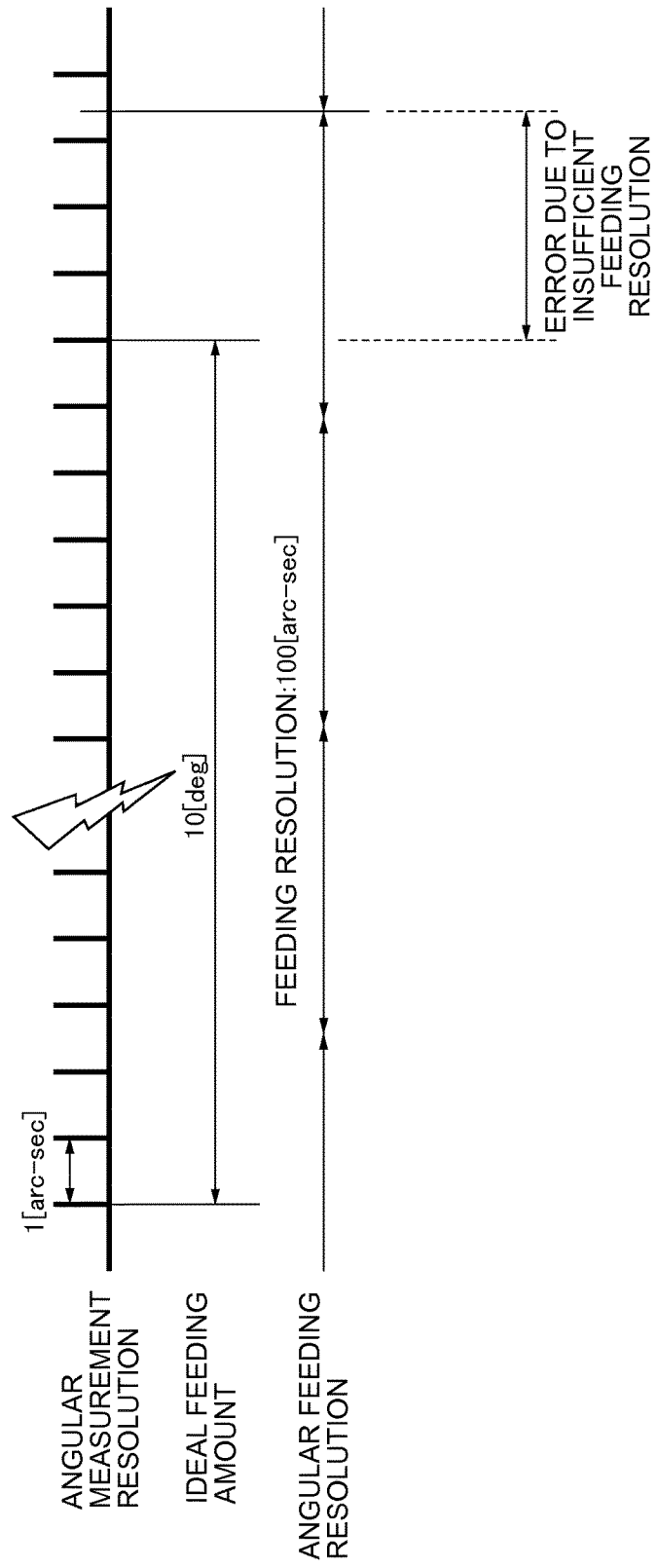
FIG. 5 is graph showing one example of an angular measurement resolution, an ideal amount of feeding for a roller mold, and an angular feeding resolution of a rotational drive motor.
Figure 6:
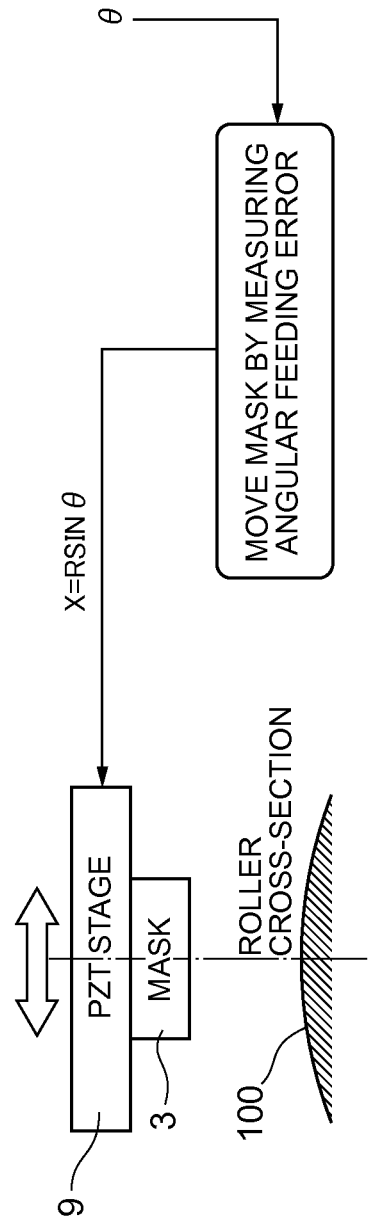
FIG. 6 is a view illustrating processing for moving a stage and a stencil mask according to an error due to insufficient feeding resolution.

Further descriptions will be made below, based on specific examples (see FIG. 5, etc.). If the resolution of angular measurement using the rotary encoder 12 is 1 [arc-sec], it is possible to detect a feeding amount of 10 [deg], which is one example of an ideal feeding amount (a target position), with a high level of accuracy. On the other hand, if the angular feeding resolution of the rotational drive motor 4 is, for example, only about 100 [arc-sec], such insufficient feeding resolution will cause errors and may lead to cases in which the roller mold 100 cannot be stopped at the target position (see FIG. 5). In such cases, this embodiment uses the rotary encoder 12 to measure an angular feeding error due to such insufficient feeding resolution (step SP3) and sends the measurement result (detection signal) to the control apparatus 6 (step SP4). When receiving such detection signal, the control apparatus 6 sends to the actuator 7 a control signal (moving command) for adjusting the circumferential position of the electron beam writing on the resist of the roller mold 100 (step SP5). Upon receipt of the command, the actuator 7 linearly moves the stencil mask 3 in a parallel manner together with the stage 9 by an amount corresponding to the error due to the insufficient feeding resolution (step SP6). If the mask pattern MP is, for example, composed of a plurality of regularly arranged blocks (denoted by B in FIG. 8), the roller mold manufacturing apparatus 1 as described above can improve the spacing accuracy between the mask patterns MP, can thereby improve the circumferential joining accuracy, and can make the pitch P1 (circumferential spacing) between the blocks B in a single mask pattern MP coincide with the joining pitch P2 between an end block of one mask pattern MP and an end block of the adjacent mask pattern MP (see FIGS. 4, 6, 7, 8, etc.).

When the position is adjusted by linearly moving the stencil mask 3 together with the stage 9, the mask pattern MP is written by exposure onto the subject region (the region adjacent to the already-exposed region) (step SP7). After that, the above-described steps SP2 through SP7 are repeated until the exposure in the circumferential direction (the writing of the mask pattern MP onto the entire circumference of the roller mold 100) is finished (i.e. while the answer is NO in step SP8) (see FIG. 2). If the mask pattern MP has been written by exposure onto the entire circumference of the roller mold 100 (YES in step SP8), a determination is made as to whether or not the exposure of the roller mold 100 in the axial direction has been completed (step SP9). If the exposure in the axial direction has not been completed (NO in step SP9), the roller mold 100 is axially moved by a predetermined amount (step SP10), and the second and subsequent rows are exposed in order to be adjacent to the already-exposed region (steps SP1 through SP8, see FIG. 8). When the exposure of the roller mold 100 is completed in the axial direction (YES in step SP9), the resist is developed, etched and then removed, and the manufacture of the roller mold 100 ends.

It should be noted that, when performing exposure of the second and subsequent rows, the roller mold 100 can be moved in the axial direction of the rotational shaft 8 by activating the axial movement motor 11 and moving the axially moving stage 13 by a predetermined amount (see FIG. 1). Although not particularly shown in the drawings, in addition to the above-described actuator 7, another actuator for axially moving the stencil mask 3 for fine adjustment may be provided so that the axial position of the stencil mask 3 can be finely adjusted. After that, the next mask pattern MP is written onto a region adjacent to the mask pattern MP that has been written already, such that the axial pitch P3 between the blocks B is a predetermined spacing (see FIG. 8).

As described above, in the roller mold manufacturing apparatus 1 of this embodiment, the roller mold 100 is rotated by the rotational drive motor 4 around the rotational shaft 8, and after that, the stencil mask 3 is moved slightly by the stage 9 (or by the actuator 7 included in the stage 9) in accordance with the control signal from the control apparatus 6. With this configuration, the position of the electron beam irradiation can be changed slightly and fine adjustment of the writing position can be achieved, without the need to slightly feed the roller mold 100 and rotate it at a slight angle. By using such roller mold manufacturing apparatus 1 in a so-called step-and-repeat method in which the mask pattern MP is circumferentially written by exposure onto each predetermined region on the surface of the roller mold 100, the exposure can be performed while adjusting the pitch P2 between the mask patterns MP to a specified value with a high level of accuracy. In addition, it is possible to suppress the occurrence of misalignment at a seam after a 360-degree rotation.

Moreover, in the roller mold manufacturing apparatus 1, the stage 9 (or the actuator 7 included in the stage 9) moves the stencil mask 3 linearly and such movement can be realized by an extremely simple mechanism and configuration. As a result, the configuration can easily be simplified and is advantageous in terms of weight, size and cost, as compared to apparatuses of a two-step configuration which use a motor to rotate the roller mold 100 and which further use a piezo device, etc., to feed the roller mold 100 at a slight angle.

Furthermore, the roller mold manufacturing apparatus 1 of this embodiment does not rotate the roller mold 100 for fine adjustment, but instead, only moves the stencil mask 3, which is lighter in weight than the roller mold 100, in order to follow such adjustment. As a result, the roller mold manufacturing apparatus 1 can achieve an adjustment operation with excellent responsiveness and good following capability. In particular, the weight of the roller mold 100 naturally increases as the surface length thereof increases, while the size and weight of the stencil mask 3 remain constant regardless of the roller surface length; therefore, the effect becomes even more remarkable as the surface length of the roller mold 100 increases.

The above-described embodiment is a suitable example of carrying out the present invention; however, the present invention is not limited thereto and can be implemented with various modifications without departing from the gist of the present invention. For example, the above embodiment describes an example in which a piezoelectric actuator (piezo actuator) including a piezoelectric device (piezo device) is used as the actuator 7 and in which the stencil mask 3 is moved linearly by using the stage 9. However, such piezoelectric device is just one suitable example of the actuator 7, and other devices, etc., may also be used as the actuator.

Furthermore, in the above embodiment, an electron beam is formed into parallel light beams through a lens and the stencil mask 3 is irradiated with such parallel beams. The term "parallel" as used herein may mean not only a completely parallel state, but also other states (e.g., a moderately collected state). In other words, one feature of this embodiment is that several electron beams that have passed through the stencil mask 3 are used to simultaneously write a pattern in a particular region on the resist, and such simultaneous writing on the resist is still possible even if the several electron beams are not completely parallel. From this viewpoint, the types of such several electron beams which are applicable are not limited to completely parallel beams.

The above embodiment describes a form of using the electron beam irradiation apparatus 2 to irradiate the roller mold 100 with electron beams (electron beam lithography). However, this is also just one suitable example and the roller mold 100 may be manufactured through an exposure means involving a different irradiating substance (irradiation target), for example, exposure involving irradiation with light (photolithography). In that case, a mask (reticle) may be made of glass, with predetermined portions thereof being masked. Light applied from the light irradiation apparatus is blocked by masked portions of the mask, while light passes through unmasked portions (light transmitting portions) and the roller mold 100 is irradiated with the light that has passed through the unmasked portions. In such exposure to light (photolithography), the roller mold 100 may be irradiated with light that has passed through the mask, as is (one-to-one exposure). Alternatively, the light that has passed through the mask may be caused to further pass through a lens (not shown in the drawings) and the roller mold 100 may be irradiated with the light focused by the lens (reduction exposure). A specific example of such exposure to light is extreme ultraviolet lithography using extreme ultraviolet light.

Example 1

The present inventors studied the influence on the depth of writing when moving the stencil mask 3. The results of such study will be described below as Example 1 (see FIG. 9, etc.).

The distance X between a vertical line V through the center of the roller mold 100 and a vertical line V1 through the center of the stencil mask 3 that has been moved in a parallel manner (such distance will hereinafter be referred to as a "correction amount") (see FIG. 4) is determined by:

$$X = R \sin \theta$$

where θ is an angle made by the vertical line V and an oblique line S through the target writing position P (the position shifted to offset the error caused due to the insufficient feeding resolution of the rotational drive motor 4) and the center of the roller mold 100 (such angle will hereinafter be referred to as an "angular difference") (see FIG. 3), and R is the radius of the roller mold 100.

Figures 9, 10:
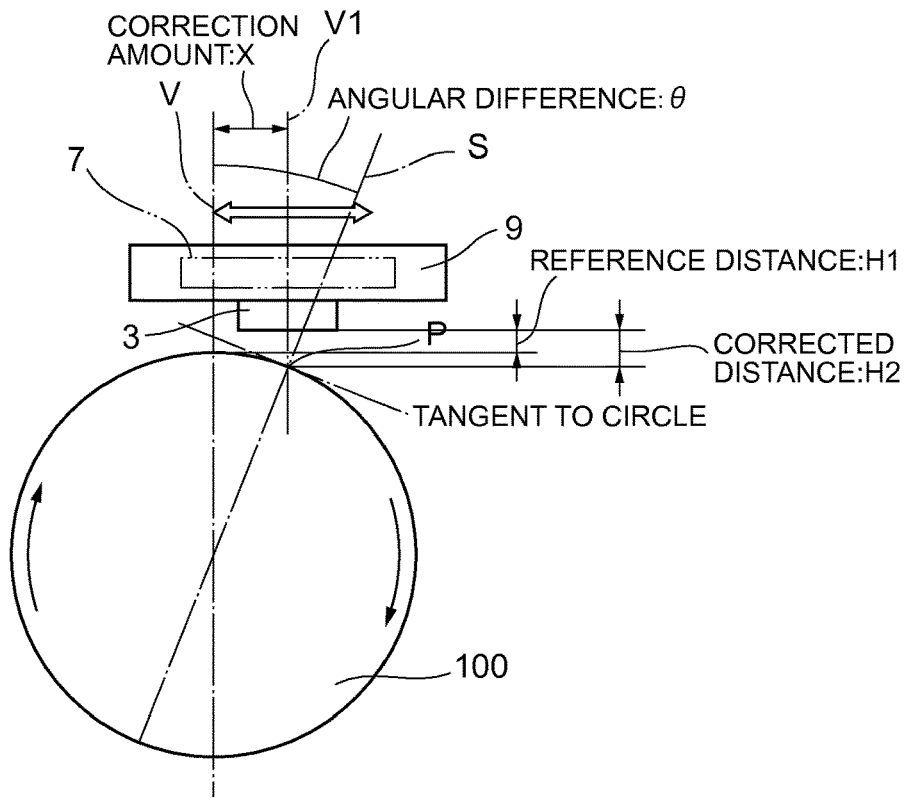
FIG. 9 is a view of a roller mold and other components when seen from the axial direction of a rotational shaft, for explaining each value which was used when studying the influence of the movement of a stencil mask on the depth of writing.
FIG. 10 is a chart showing the results of a study about the influence of the movement of a stencil mask on the depth of writing.
Figure 11:
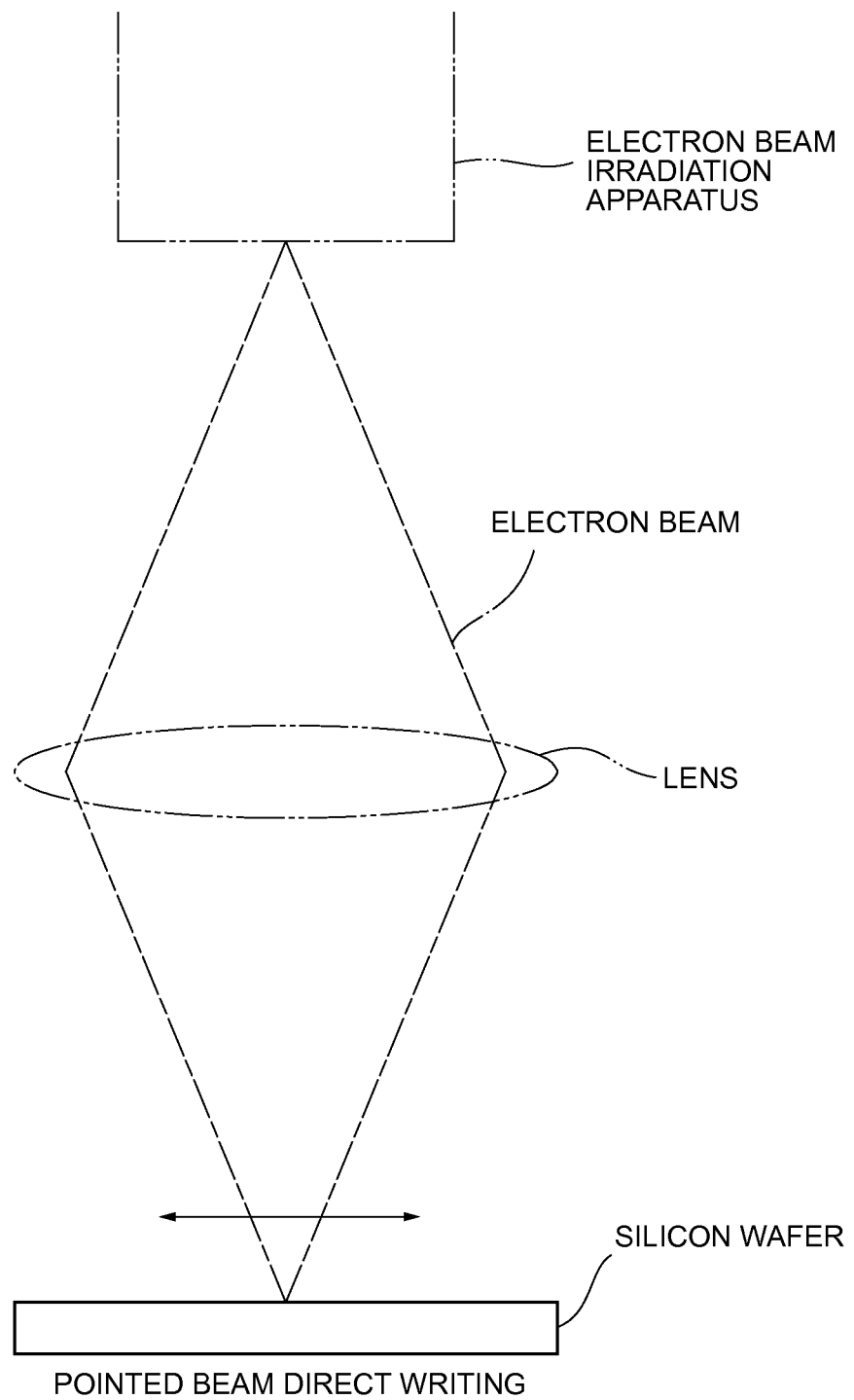
FIG. 11 is a reference view illustrating an exposure of a roller mold in which an electron beam is focused through a lens and a resist is irradiated with the beam so as to write a pattern on the resist.
Figure 12:
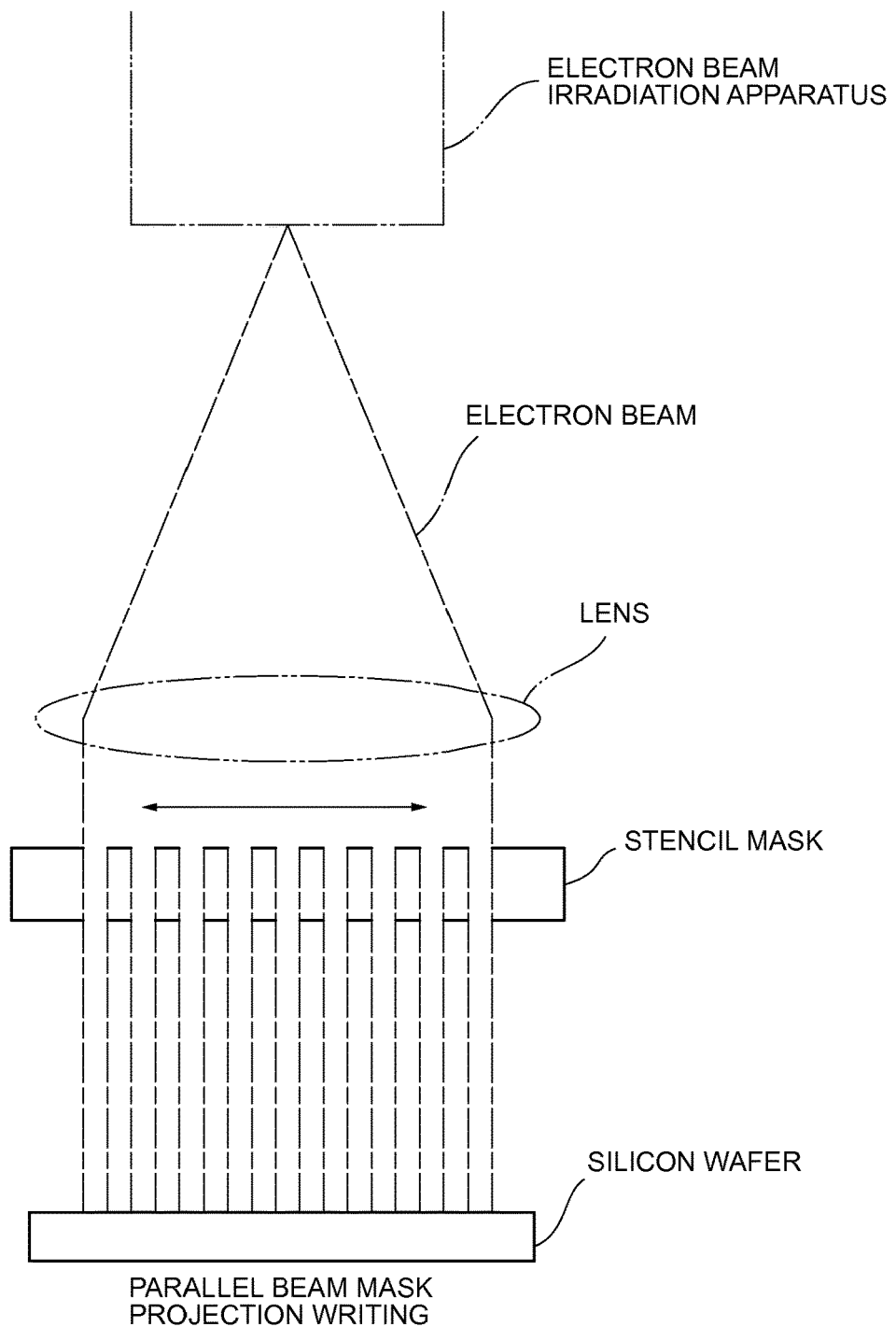
FIG. 12 is a view illustrating an exposure of a roller mold in which a stencil mask on which an aperture pattern is formed is irradiated with an electron beam which has been formed into substantially parallel light beams through a lens, so that a resist is irradiated with several electron beams that have passed through the stencil mask, thereby simultaneously writing a pattern on the resist with the beams.
Figure 13A:
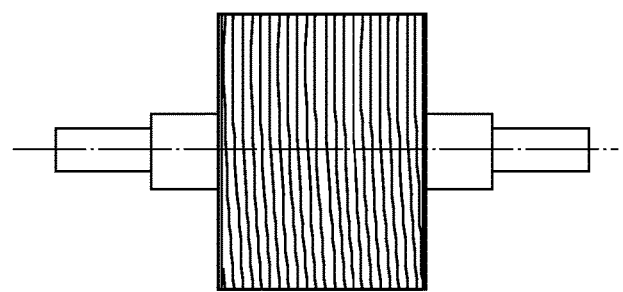
FIG. 13A is an overall view of a roller mold attached around a rotational shaft and FIG. 13B is a development view of the surface of the roller mold, for illustrating one example of a line-and-space pattern formed on the roller mold.
Figure 13B:
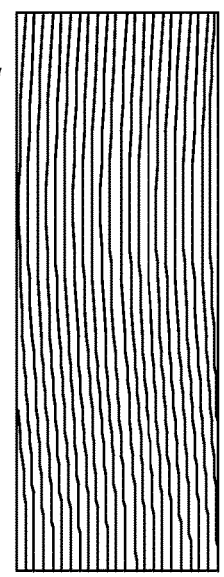
Figure 15:
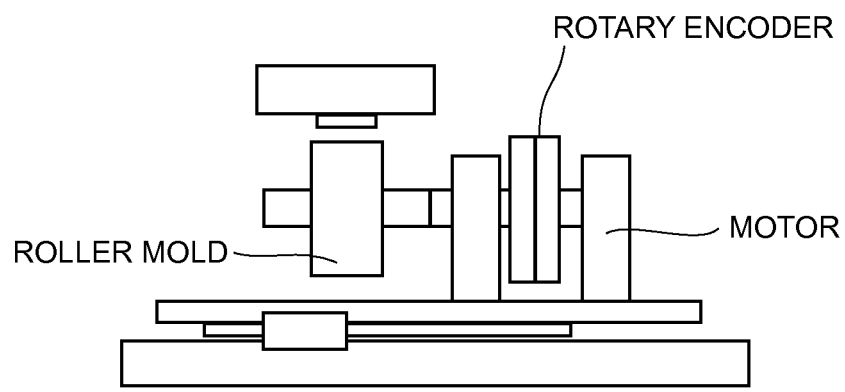
FIG. 15 is a view illustrating, for reference, an example of a roller mold manufacturing apparatus which is configured to: measure an amount of rotation (angle of rotation) of a roller mold using a rotary encoder; activate a motor with a high level of accuracy, based on the measurement result; and feed the roller mold at a predetermined angle.
Figure 16:
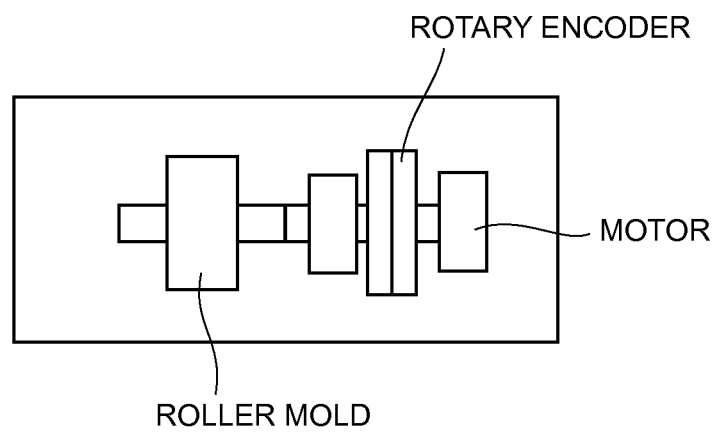
FIG. 16 is a plan view illustrating, for reference, an example of a roller mold manufacturing apparatus which is configured to: measure an amount of rotation (angle of rotation) of a roller mold using a rotary encoder; activate a motor with a high level of accuracy, based on the measurement result; and feed the roller mold at a predetermined angle.
Figure 17:
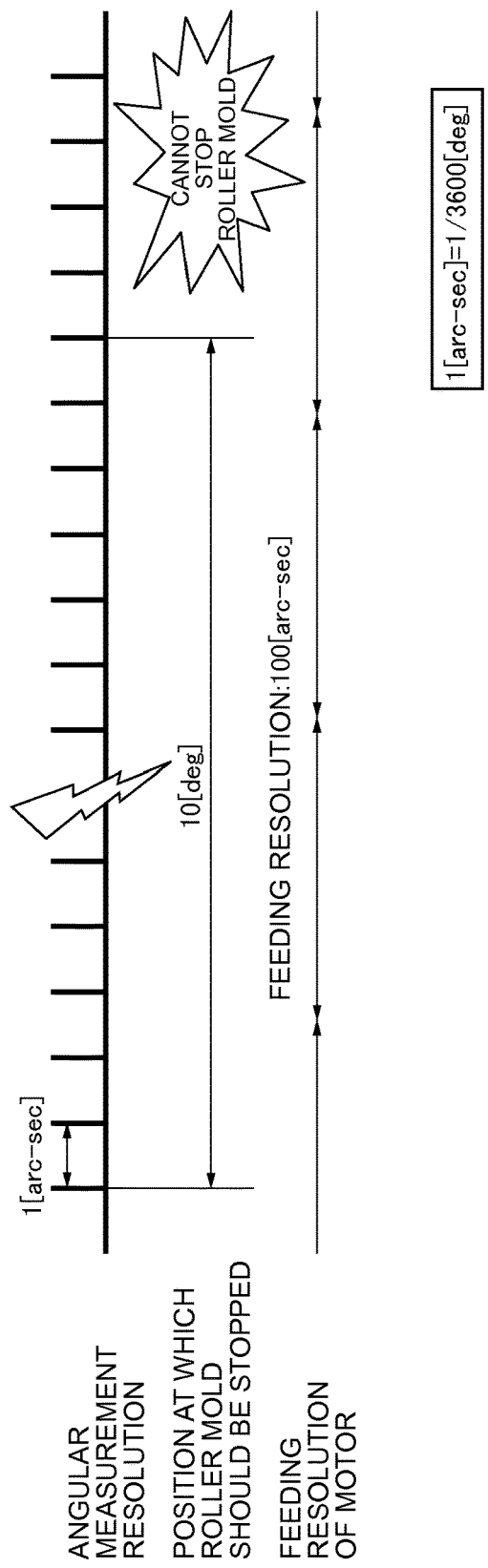
FIG. 17 is a graph showing an example of an angular measurement resolution, an ideal amount of feeding for a roller mold, and an angular feeding resolution of a motor, in the manufacturing apparatuses shown in FIGS. 15 and 16.
Figure 18:
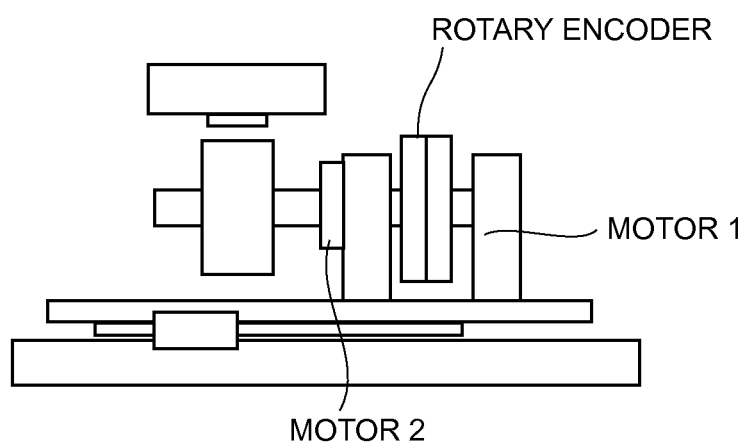
FIG. 18 is a view illustrating, for reference, an example of a roller mold manufacturing apparatus which is equipped with not only a motor but also a rotational drive apparatus which can achieve fine feeding so as to realize a highly accurate feeding resolution by way of a two-step configuration of the motor and the drive apparatus.
Figure 19:
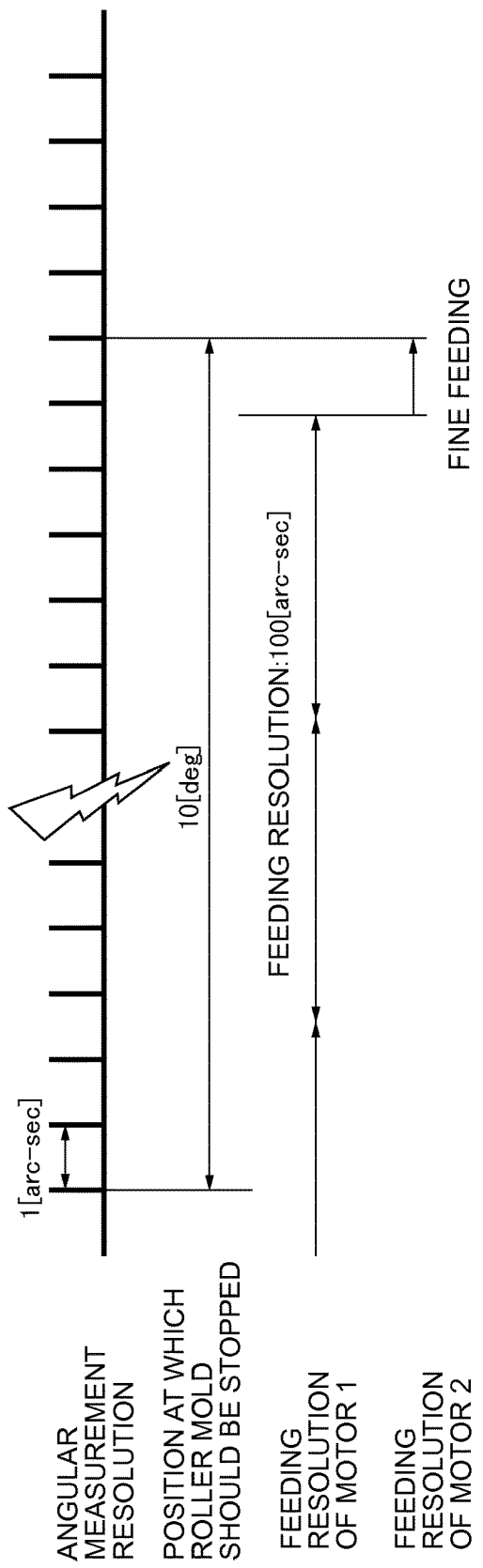
FIG. 19 is a graph showing an example of an angular measurement resolution, an ideal amount of feeding for a roller mold, and an angular feeding resolution of a motor, in the manufacturing apparatus shown in FIG. 18.

In addition, the shortest distance between the stencil mask 3 and the roller mold 100 (the distance between the stencil mask 3 and the roller mold 100 along the vertical line V) is set as a reference distance H1 (see FIG. 9). The distance between the stencil mask 3 that has been moved in a parallel manner and the target writing position P on the roller mold 100 (the distance between the stencil mask 3 and the roller mold 100 along the vertical line V1) is set as a corrected distance H2.

Based on the above setting, an example of the roller mold 100 having a diameter (roller diameter) of 100 [mm] was studied regarding: (1) the angular difference θ; (2) the angle of tangent to the circle (the slope of the tangent at the target writing point P); (3) the correction amount X; and (4) the distance variation between the stencil mask 3 and the position P (i.e., corrected distance H2−reference distance H1) [mm] (see FIG. 10).

As a result of the study, it was confirmed that the slope of the tangent to the circle was actually extremely small and at a negligible level. In other words, it was confirmed that the correction amount X was extremely small relative to the curvature of the circle and the surface of the roller mold 100 was able to be regarded as a flat surface in such a small limited region.

Regarding (4) the distance variation between the stencil mask 3 and the roller mold 100 (corrected distance H2−reference distance H1) [mm], it was confirmed that the value was also extremely small and the influence of such change in the depth of writing on the accuracy of the writing or the quality of the written pattern was also at a negligible level.

In addition, when the correction amount X of the mask was 24.24 [um], the variation (corrected distance H2−reference distance H1) (4) was only 0.006 [mm]. This demonstrates that positioning can be achieved by using a commercially available common piezo stage if the correction amount X of the mask is about 25 [um].

INDUSTRIAL APPLICABILITY

The present invention is suited for use in an apparatus and method for manufacturing a roller mold which is a roller-shaped stamping die for transferring a pattern.

DESCRIPTION OF REFERENCE NUMERALS

1 Roller mold manufacturing apparatus
2 Electron beam irradiation apparatus (irradiation apparatus)
3 Stencil mask (mask)
4 Rotational drive motor (rotational drive apparatus)
6 Control apparatus
7 Actuator
8 Rotational shaft
12 Rotary encoder (rotation amount detection sensor)
100 Roller mold

What is claimed is:

1. An apparatus for manufacturing a roller mold which is a roller-shaped stamping die for transferring a pattern, the apparatus comprising:
an irradiator that irradiates a predetermined area of the roller mold, which is coated with a resist, with an irradiation in a state where rotation of the roller mold is stopped;
a mask that allows part of the irradiation applied from the irradiator to pass through the mask and converts the irradiation into a plurality of parallel beams;
a rotator that rotates the roller mold around a rotational shaft;
a rotation amount detection sensor that detects an amount of rotation of the roller mold while being rotated by the rotator;
a controller that receives a detection signal from the rotation amount detection sensor and sends to an actuator a control signal for adjusting a circumferential position of irradiation when the resist of the roller mold is irradiated with the irradiation; and
the actuator that linearly moves the mask in a circumferential direction of the roller mold perpendicular to the irradiation direction of the beam in accordance with the control signal from the controller, wherein the irradiator, the rotator, the rotation amount detection sensor, and the controller are configured to: irradiate the predetermined area of the roller mold by the irradiator in a state where the rotation of the roller mold is stopped;
rotate the roller mold by the rotator, feed at a predetermined angle so as to expose a next predetermined area, and stop the rotation of the roller mold, and adjust a circumferential position of irradiation for irradiating the next predetermined area with the irradiator by moving the mask by the actuator in the circumferential direction of the roller mold perpendicular to the irradiation in a state where the rotation of the roller mold is stopped; and
wherein the irradiator, the rotator, the rotation amount detection sensor, and the controller are configured to calculate the control signal based on a difference between the rotation amount of the roller mold detected by the detection sensor and a target rotation amount thereof, the control signal having a correction amount of movement of the mask, and are further configured to send the control signal to the actuator.

2. The roller mold manufacturing apparatus according to claim 1, wherein the actuator is a piezoelectric actuator.

3. The roller mold manufacturing apparatus according to claim 1, wherein the irradiation is an electron beam.

4. The roller mold manufacturing apparatus according to claim 1, wherein the irradiation is light.

5. The roller mold manufacturing apparatus according to claim 1, wherein
the irradiation is an electron beam, and
the mask converts the electron beam that has passed through the mask into a plurality of parallel electron beams.

6. A method for manufacturing a roller mold which is a roller-shaped stamping die for transferring a pattern, using the apparatus of claim 1, the method comprising:
causing an irradiating substance applied from an exposure apparatus to pass through a mask so as to form the irradiating substance into a plurality of beams of irradiating substance;
rotating the roller mold, which is coated with a resist, around a rotational shaft and stopping the roller mold at a predetermined position;
detecting an amount of rotation of the roller mold and sending from a control apparatus a control signal for adjusting a circumferential position on the resist of the roller mold for irradiation with the irradiating substance;
moving the mask linearly in accordance with the control signal;
adjusting a position on the resist of the roller mold for irradiation with the irradiating substance; and
irradiating the roller mold with the irradiating substance that has passed through the mask.

7. The roller mold manufacturing method according to claim 6, wherein the irradiating substance that has passed through the mask is formed into a plurality of parallel light beams.

8. The roller mold manufacturing method according to claim 6, wherein the mask is moved by an actuator in a circumferential direction of the roller, which is perpendicular to an irradiation direction of the irradiating substance.

9. The roller mold manufacturing method according to claim 7, wherein the mask is moved by an actuator in a circumferential direction of the roller, which is perpendicular to an irradiation direction of the irradiating substance.

10. The roller mold manufacturing method according to claim 6, wherein the irradiating substance is an electron beam.

11. The roller mold manufacturing method according to claim 6, wherein the irradiating substance is light.

12. The roller mold manufacturing method according to claim 6, wherein the irradiating substance is an electron beam, and
the mask forms the electron beam that has passed through the mask into a plurality of parallel light beams of the electron beam.

13. An apparatus for manufacturing a roller mold which is a roller-shaped stamping die for transferring a pattern, the apparatus comprising:

an irradiator that irradiates a predetermined area of the roller mold, the irradiator being configured to irradiate in a state where rotation of the roller mold is stopped;
a mask with a predetermined pattern which allows part of the irradiation irradiated from the irradiator to pass through the mask and changes the irradiation into a plurality of parallel beams;
a rotator for rotating the roller mold around a rotation axis, the rotator configured to rotate and stop the roller mold so that the plurality of beams are irradiated to a first predetermined area of the roller mold, and further configured to rotate and stop the roller mold so that the plurality of beams are irradiated to a second predetermined area of the roller mold after the irradiation to the first predetermined area;
an actuator that moves the mask in a circumferential direction of the roller mold perpendicular to an irradiation direction of the plurality of beams, the actuator configured to move the mask in a state where the rotation of the roller mold by the rotator is stopped and to correct a circumferential irradiation position irradiated on the roller mold,
a rotation amount detection sensor that detects an amount of rotation of the roller mold while being rotated by the rotator; and
a controller that receives a detection signal from the rotation amount detection sensor and transmits a control signal to the actuator, the controller being configured to calculate the control signal based on a difference between the rotation amount of the roller mold detected by the detection sensor and a target rotation amount thereof, the control signal having a correction amount of movement of the mask, and the controller being further configured to send the control signal to the actuator.

* * * * *